(12) United States Patent
Kato

(10) Patent No.: US 9,563,118 B2
(45) Date of Patent: Feb. 7, 2017

(54) PHOTOMASK, METHOD OF MANUFACTURING PHOTOMASK AND EXPOSURE APPARATUS

(71) Applicant: Sakai Display Products Corporation, Sakai-shi, Osaka (JP)

(72) Inventor: Masahiro Kato, Sakai (JP)

(73) Assignee: Sakai Display Products Corporation, Sakai-shi, Osaka (JP)

( * ) Notice: Subject to any disclaimer, the term of this patent is extended or adjusted under 35 U.S.C. 154(b) by 110 days.

(21) Appl. No.: 14/420,584

(22) PCT Filed: Jan. 28, 2014

(86) PCT No.: PCT/JP2014/051763
§ 371 (c)(1),
(2) Date: Feb. 9, 2015

(87) PCT Pub. No.: WO2014/123030
PCT Pub. Date: Aug. 14, 2014

(65) Prior Publication Data
US 2015/0219987 A1  Aug. 6, 2015

(30) Foreign Application Priority Data

Feb. 7, 2013  (JP) ................. 2013-022429

(51) Int. Cl.
*G03F 1/42*  (2012.01)
*G03F 1/38*  (2012.01)
*G03F 7/20*  (2006.01)

(52) U.S. Cl.
CPC . *G03F 1/42* (2013.01); *G03F 1/38* (2013.01); *G03F 7/70525* (2013.01); *G03F 7/70733* (2013.01); *G03F 7/70783* (2013.01)

(58) Field of Classification Search
CPC .......... G03F 1/42; G03F 1/38; G03F 7/70525; G03F 7/70733; G03F 7/70783
USPC .................................................. 430/5, 22, 30
See application file for complete search history.

(56) References Cited

U.S. PATENT DOCUMENTS

2009/0310106 A1  12/2009  Mishima
2012/0133914 A1   5/2012  Prosyentsov et al.

FOREIGN PATENT DOCUMENTS

| JP | 08-274019 A | 10/1996 |
|---|---|---|
| JP | 2003-282426 A | 10/2003 |
| JP | 2004-317975 A | 11/2004 |
| JP | 2005-017314 A | 1/2005 |
| JP | 2005-128042 A | 5/2005 |
| JP | 2009-302400 A | 12/2009 |
| JP | 2010-182942 A | 8/2010 |
| JP | 2012-119680 A | 6/2012 |

*Primary Examiner* — Christopher Young
(74) *Attorney, Agent, or Firm* — Rudy J. Ng; Bret E. Field; Bozicevic, Field & Francis LLP

(57) ABSTRACT

On a photomask used for exposure processing, a plurality of pattern regions on which predetermined patterns are formed using a light shielding material are provided, and calibration marks are formed at positions corresponding to at least two opposite sides of each pattern region. During exposure processing, a deformation state of the photomask is detected based on calibration marks formed on the photomask and marks formed on a substrate stage, and a projection condition for projecting a pattern formed on the photomask on the substrate is corrected based on the detection result.

11 Claims, 12 Drawing Sheets

F I G. 4
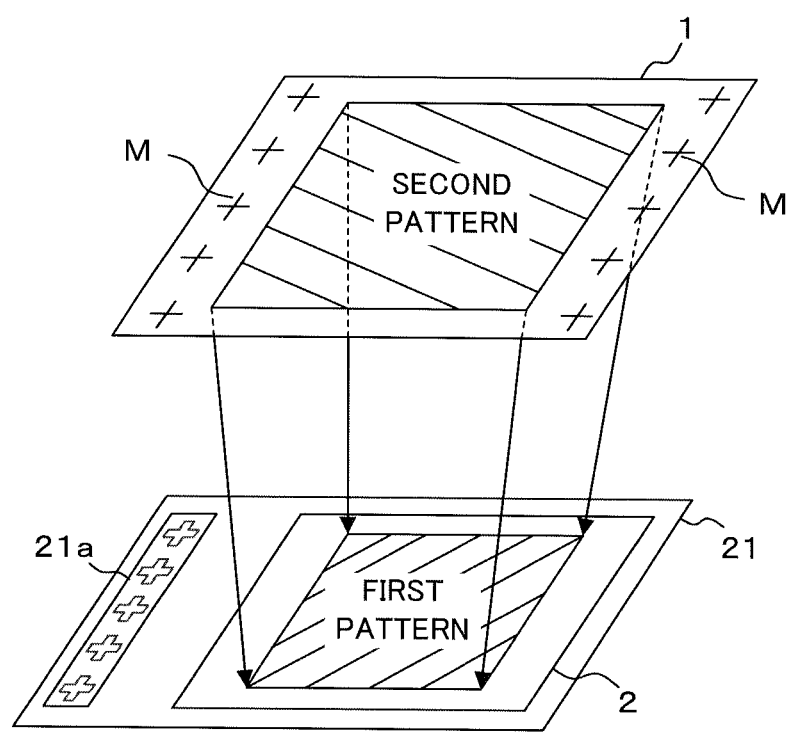

PHOTOMASK, METHOD OF MANUFACTURING PHOTOMASK AND EXPOSURE APPARATUS

CROSS-REFERENCE TO RELATED APPLICATION

This application is the national phase under 35 U.S.C. §371 of PCT International Application No. PCT/JP2014/051763 which has an International filing date of Jan. 28, 2014 and designated the United States of America.

BACKGROUND

1. Technical Field

The present invention relates to a photomask, on which a pattern is formed with a light shielding material, for transferring the pattern to a photoresist with light passed through the photomask, a method of manufacturing the photomask, and an exposure apparatus.

2. Description of Related Art

In recent years, for a display apparatus displaying a picture and an image, a liquid crystal display panel using a TFT (Thin Film Transistor) for example has widely been used. Also, a technique of photolithography is often used in manufacturing a liquid crystal display panel, a semiconductor device, a printed substrate and the like.

A photolithography is a technique of transferring and developing a pattern formed on a photomask on a substrate by irradiating light from a light source onto the substrate through the photomask after applying a photoresist on the substrate. On the photomask, a predetermined pattern to be transferred to the substrate is formed with a light shielding material. Therefore, the predetermined pattern is transferred on the substrate by irradiating light passed through areas other than the predetermined pattern to the substrate.

In exposure processing in which light from a light source is irradiated onto a substrate through a photomask, the photomask is expanded (deformed) due to heat from the light source. Accordingly, even when the same photomask is used, a difference occurs in patterns transferred on the substrate depending on the degree of expansion of the photomask, which may cause exposure flaws.

Therefore, Japanese Patent Application Laid-Open No. 2010-182942 proposes a technique of configuring, in a stage device for holding a photomask, a surface being in contact with a photomask using a plurality of materials having coefficients of thermal expansion different from each other. Japanese Patent Application Laid-Open No. 2010-182942 also proposes a technique of configuring, in the photomask, a surface being in contact with the stage device using a plurality of materials having coefficients of thermal expansion different from each other. In the technique disclosed in Japanese Patent Application Laid-Open No. 2010-182942, expansion occurred in the photomask during exposure processing can be suppressed by using differences in the degrees of expansion between a plurality of materials having different coefficients of thermal expansion.

SUMMARY

However, when a stage device is configured in such a manner that materials having different coefficients of thermal expansion are used for a surface being in contact with a photomask, there is a problem that the configuration of the stage device needs to be changed which requires time and cost therefor. Also, when a photomask is configured in such a manner that materials having different coefficients of thermal expansion are used for a surface being in contact with the stage device, there is a problem that the cost for fabricating the photomask is increased.

The present invention has been made with the aim of solving the above problems. An object of the present invention is to provide a photomask that can suppress occurrence of an exposure flaw even when the photomask is expanded in exposure processing, a method of manufacturing the photomask and an exposure apparatus.

A photomask according to the present invention is characterized by including a plurality of pattern regions having patterns formed with a light shielding material, and transferring the patterns to a photoresist with light passed through the pattern regions. In the photomask according to the present invention, each of the pattern regions has a rectangular shape and marks are formed at positions corresponding respectively to two opposite sides of each of the pattern regions.

The photomask according to the present invention is characterized in that the marks are formed with a same light shielding material as the light shielding material for the pattern.

The photomask according to the present invention is characterized in that the marks are located at positions corresponding respectively to four sides of each of the pattern regions.

The photomask according to the present invention is characterized in that at least one of the pattern regions has a shape and size different from shapes and sizes of the other pattern regions.

The photomask according to the present invention is characterized in that at least one of the pattern regions has a pattern with an order in which the pattern is transferred to the photoresist, the order being different from orders of patterns of the other pattern regions.

A method of manufacturing a photomask according to the present invention is characterized by comprising a step of forming, with a light shielding material, a plurality of patterns included respectively in a plurality of rectangular regions and marks located at positions corresponding respectively to two opposite sides of each rectangular region on a transparent substrate.

An exposure apparatus according to the present invention is characterized in that the exposure apparatus, by using any one of the above-mentioned photomasks, transfers a pattern formed on the photomask to a substrate applied with a photoresist.

The exposure apparatus according to the present invention is characterized by comprising: a mounting table on which a mark is located at a predetermined position and the photomask is mounted; and a setting unit for setting an exposure condition based on the mark of the mounting table and the marks of the photomask mounted on the mounting table.

According to the present invention, on a photomask on which a plurality of pattern regions are formed, marks are formed at positions corresponding respectively to two opposite sides of each pattern region. During exposure processing, based on the marks formed on the photomask, a projection condition for transferring a pattern formed on the photomask onto the substrate is corrected. Accordingly, even when the photomask is expanded (deformed) during the exposure processing, the pattern formed on the photomask is transferred to an appropriate area on the substrate, thereby it is possible to suppress occurrence of exposure flaws.

The above and further objects and features will more fully be apparent from the following detailed description with accompanying drawings.

BRIEF DESCRIPTION OF THE SEVERAL VIEWS OF THE DRAWINGS

FIG. 4 is a schematic view for explaining correction processing of a projection condition;

DETAILED DESCRIPTION

The following will describe in detail the present invention with reference to the drawings illustrating an embodiment thereof.

Figure 1:
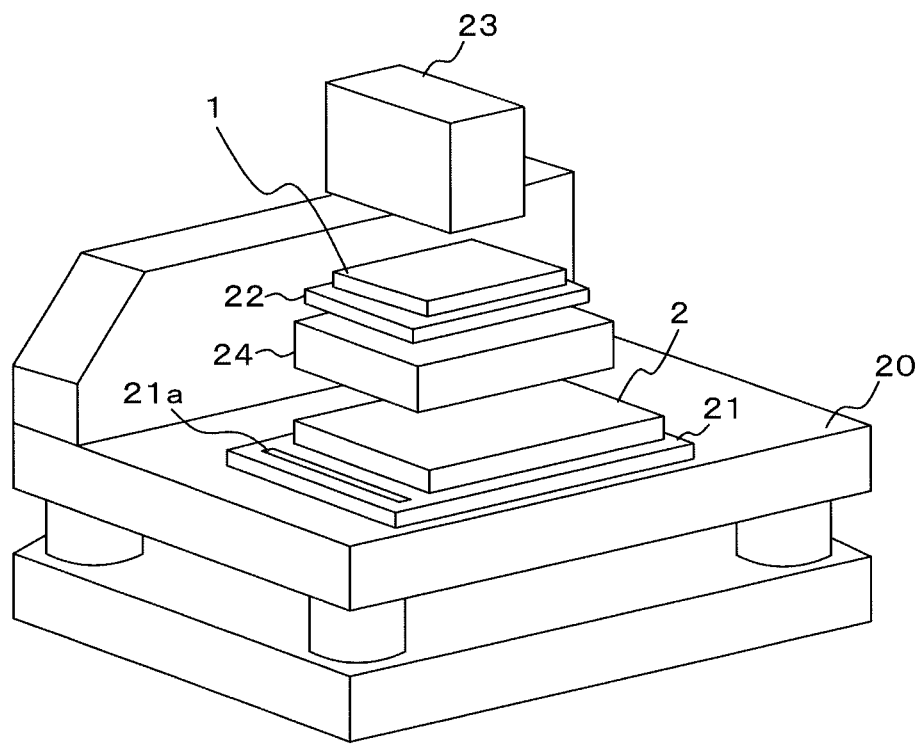
FIG. 1 is a schematic perspective view illustrating an exposure apparatus according to an embodiment of the present invention.

FIG. 1 is a schematic perspective view illustrating an exposure apparatus according to the present embodiment. The exposure apparatus of the present embodiment has a substrate stage 21 which is located on a base 20 to be placed on a flat surface, and on which a substrate 2 to be exposed to light is mounted (held). In the substrate stage 21, an upper surface on which the substrate 2 is mounted (placed) is formed in a flat surface parallel to the horizontal plane. The substrate 2 is, for example, a rectangular glass substrate used for manufacturing a liquid crystal display panel. In the substrate 2, a photoresist (photosensitive material) is applied to one surface in a pretreatment of the exposure processing by the exposure apparatus. The substrate 2 is placed on the substrate stage 21 in a state where the surface applied with the photoresist faces up. A predetermined position of the upper surface of the substrate stage 21 is provided with a mark region 21a where marks are formed which are used in correction processing of a projection condition (an exposure condition) which is performed in exposure processing, as described later.

Above the substrate stage 21, an optical lens system 24 is provided. Just above the optical lens system 24, a mask stage (corresponding to mounting table) 22 is provided on which a photomask 1 is mounted (held), and further above, a light source unit 23 for irradiating exposure light is provided.

The light source unit 23 includes, for example, a light source lamp that emits ultraviolet (exposure light) such as a mercury lamp or an excimer lamp, a collector mirror, a reflector and the like. The light source unit 23 irradiates exposure light from the upper side to the upper surface of the photomask 1 placed on the mask stage 22. Also, the light source unit 23 has a function for controlling (ON/OFF) irradiation of exposure light.

The mask stage 22 is configured to have, for example, a frame-like shape (tubular shape) and holds a peripheral portion of a lower surface of the photomask 1 by the upper surface thereof. The photomask 1 is a transparent substrate formed with, for example, glass, quartz or the like. On one surface of the photomask 1, a pattern to be transferred (projected) to the substrate 2 is formed using a light shielding material (light shielding film) such as chromium (Cr). The photomask 1 is mounted (placed) on the mask stage 22 in a state where the surface on which a pattern is formed faces down.

The optical lens system 24 includes a large lens configured by connecting a plurality of lenses. The optical lens system 24 is located in such a manner that the upper surface of the large lens is faced to the lower surface of the photomask 1 and the lower surface of the large lens is faced to the upper surface of the substrate 2. The optical lens system 24 projects a pattern formed on the photomask 1 to the upper surface of the substrate 2 by irradiating exposure light from the light source unit 23 which passed through the photomask 1 to the upper surface of the substrate 2 positioned under the optical lens system 24. The optical lens system 24 according to the present embodiment projects a pattern formed on the photomask 1 to the substrate 2 with a projection rate of equal to or less than 1. However, the optical lens system 24 may project with a projection rate of more than 1.

Figure 2A:
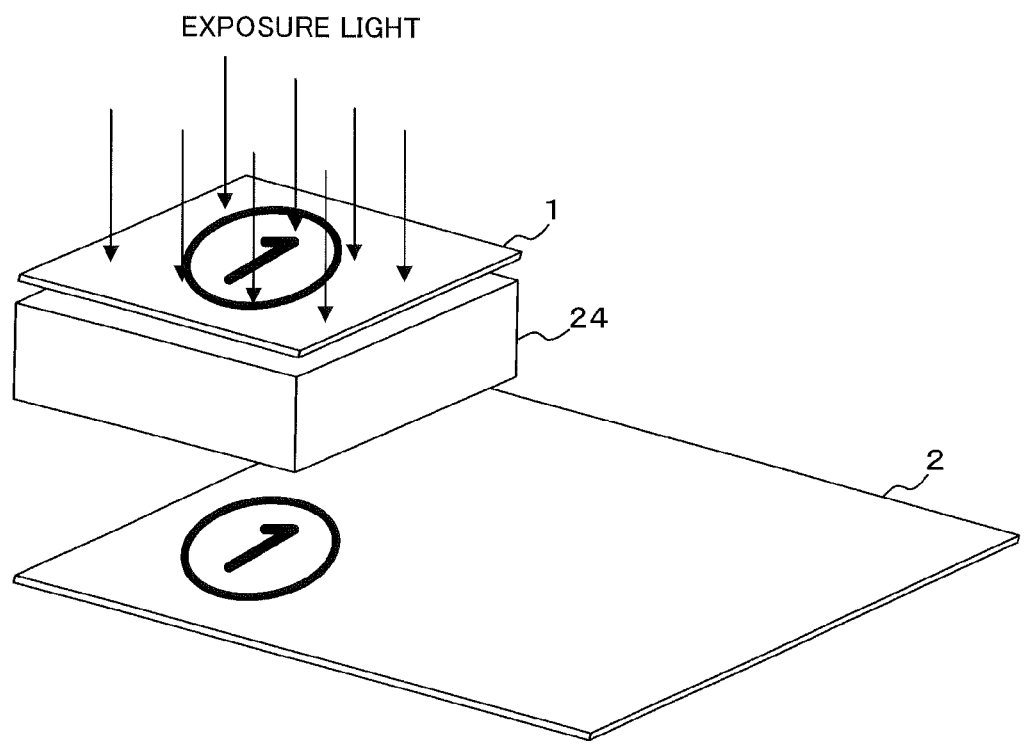
FIG. 2A is a schematic view for explaining an example of exposure processing by the exposure apparatus according to the embodiment.
Figure 2B:
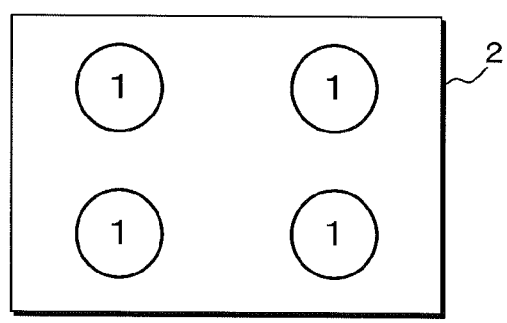
FIG. 2B is a schematic view for explaining an example of exposure processing by the exposure apparatus according to the embodiment.

FIGS. 2A and 2B are schematic views for explaining an example of exposure processing by the exposure apparatus according to the present embodiment. In the above-described exposure apparatus, the light (exposure light) from the light source unit 23 is irradiated to the photomask 1 from the upper side, and the exposure light passes through an area where no pattern is formed on the photomask 1. Then, after the exposure light passed through the photomask 1 passes through the optical lens system 24, the light is irradiated to the substrate 2. Thereby, as illustrated in FIG. 2A, a pattern formed on the photomask 1 is projected on the substrate 2. The property of the photoresist applied on the substrate 2 varies in a portion irradiated with exposure light and a portion not irradiated with exposure light, and either the portion irradiated with exposure light or the portion not irradiated with exposure light is removed in the subsequent developing processing.

In the exposure apparatus of the present embodiment, the positions of the light source unit 23 and the optical lens system 24 are fixed. And the mask stage 22 and the substrate stage 21 are configured to be able to move while holding the photomask 1 and the substrate 2, respectively. During the exposure processing, the mask stage 22 and the substrate stage 21 respectively move while maintaining the relative positions of the photomask 1 and the substrate 2. Specifically, if the light source unit 23 has a linear-shaped irradiation area (if the light source unit 23 is a linear light source), when the exposure processing starts, the photomask 1 and the substrate 2 are arranged in such a manner that one end side of the photomask 1 (region of a pattern formed on the photomask 1) is located at a position (exposure position, the linear-shaped irradiation area) to which exposure light from the light source unit 23 is irradiated, and under the position, one end side of a region in the substrate 2 in which the pattern of the photomask 1 is to be transferred is located. After the exposure processing starts, the mask stage 22 and the substrate stage 21 respectively start moving in a direction orthogonal to the one end sides of the photomask 1 and the substrate 2, and in accordance with the movement, the photomask 1 and the substrate 2 move while maintaining their relative positions. The movement of the mask stage 22 and the substrate stage 21 is finished after another end side opposing the one end side of the photomask 1 (region of a pattern formed on the photomask 1) passes the exposure position. By performing the above-described processing, it is possible to expose the entire surface ($_{en}$tire surface of a region of a pattern to be transferred to the substrate 2) of the photomask 1 and to project the pattern of the photomask 1 to a predetermined area of the substrate 2.

Also, when a photomask 1 having a size of about one-fourth with respect to the substrate 2 is used, as illustrated in FIG. 2B, the exposure processing using the photomask 1 is performed for four times by changing the relative position of the photomask 1 and the substrate 2.

When repeatedly performing the exposure processing using the same photomask 1 for several times as described above, the exposure apparatus moves the substrate stage 21 and the mask stage 22 to predetermined positions, and appropriately changes the relative positions of the substrate 2 placed on the substrate stage 21 and the photomask 1 placed on the mask stage 22.

Also, when manufacturing a liquid crystal display panel using a TFT, the TFT is formed by transferring the patterns of a plurality of layers (levels) onto the substrate 2. In this case, it is necessary to overlay the patterns in such a manner that the transfer positions of the patterns of the layers are not misaligned. Accordingly, the exposure apparatus is configured to appropriately adjust the relative positions of the substrate 2 on the substrate stage 21 and the photomask 1 on the mask stage 22 such that a pattern to be transferred next has an appropriate positional relation to a pattern already transferred (formed) on the substrate 2.

Figure 3:
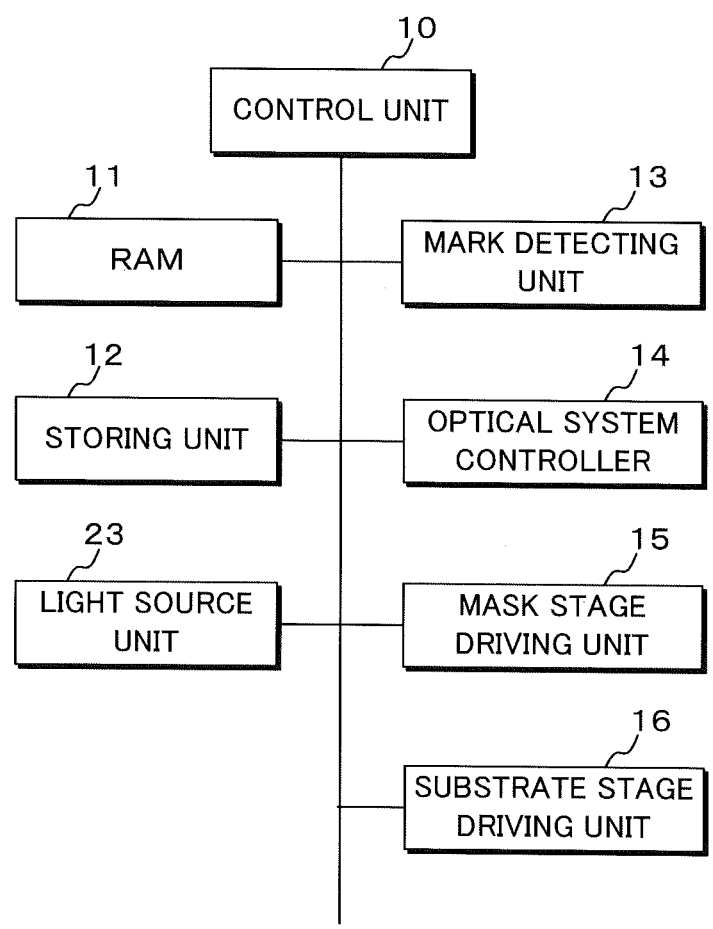
FIG. 3 is a block view illustrating an example of an internal configuration of the exposure apparatus.

FIG. 3 is a block view illustrating an example of an internal configuration of the exposure apparatus. The exposure apparatus includes a control unit 10 that controls operations of respective units configuring the exposure apparatus. The control unit 10 is a CPU (Central Processing Unit), an MPU (Micro Processor Unit) or the like. To the control unit 10, a RAM (Random Access Memory) 11, a storing unit 12, a mark detecting unit 13, an optical system controller 14, a mask stage driving unit 15, a substrate stage driving unit 16, a light source unit 23 and the like are connected through a bus. In addition to the above-described configuration, the exposure apparatus may include an operation unit for operating the exposure apparatus by a user, a notifying unit for notifying a user of an operation status of the exposure apparatus, and the like.

The storing unit 12 is an HDD (Hard Disk Drive), a flash memory or the like. The storing unit 12 stores a control program to be executed by the control unit 10 and various types of data, in advance. The RAM 11 is a DRAM, an SRAM, a flash memory or the like. The RAM 11 temporarily stores various types of data which are generated when the control unit 10 executes the control program. The control unit 10 performs an operation as the exposure apparatus by sequentially reading out the control program stored in the storing unit 12 to the RAM 11 and executing the control program.

The light source unit 23 performs emission and off of the exposure light in accordance with control from the control unit 10. Also, the light source unit 23 switches execution and termination of irradiation of the exposure light in accordance with control from the control unit 10.

The mark detecting unit 13 detects, at the time of the exposure processing, calibration marks M (see FIG. 4) formed on the photomask 1 and marks formed in a mark region 21a of the substrate stage 21. The mark detecting unit 13 detects the calibration marks M and the marks of the substrate stage 21 using an optical sensor or an image sensor, for example.

The optical system controller (corresponding to setting unit) 14 performs correction processing of a projection condition in the optical lens system 24 (for example, changing a projection rate) based on the result of detection by the mark detecting unit 13.

The mask stage driving unit 15 is driving means for moving the mask stage 22 in a direction parallel to the upper surface of the substrate 2, for example. In accordance with control from the control unit 10, the mask stage driving unit 15 disposes the mask stage 22 in a predetermined position and moves it in a predetermined direction with a predetermined speed.

The substrate stage driving unit 16 is driving means for moving the substrate stage 21 in a direction parallel to the lower surface of the photomask 1, for example. In accordance with control from the control unit 10, the substrate stage driving unit 16 disposes the substrate stage 21 in a predetermined position and also moves it in a predetermined direction with a predetermined speed.

During the exposure processing, the temperature of the photomask 1 is increased due to heat from the light source unit 23, and the photomask 1 is deformed due to thermal expansion. Specifically, expansion (deformation) of a pattern region including a pattern formed by using metal such as chromium causes deformation of the entire photomask 1. Accordingly, in order to avoid exposure flaws due to deformation of the photomask 1, the exposure apparatus performs processing of correcting (changing) a projection condition in the optical lens system 24. For example, when the exposure processing using the same photomask 1 is repeatedly performed, each time the exposure processing is performed for a predetermined number of the substrate 2, or each time the temperature of the photomask 1 reaches a predetermined temperature or more, the exposure apparatus performs processing for correcting the projection condition.

FIG. 4 is a schematic view for explaining correction processing of a projection condition.

For example, when manufacturing a liquid crystal display panel using a TFT, a plurality of the photomasks 1, on which patterns of respective layers are formed, are used and the patterns of the respective photomasks 1 are transferred on the substrate 2 in a predetermined order. FIG. 4 illustrates an example where a second pattern is transferred on the substrate 2 on which a first pattern has already been transferred (formed). On each of the plurality of photomasks 1, a pattern thereof is formed at a central portion and a plurality of (five in FIG. 4) calibration marks (corresponding to markers) M are respectively formed along two opposite end sides (left and right end sides in FIG. 4) of the photomask 1.

The calibration marks M are formed at the same positions in the photomasks 1 for the layers. The calibration mark M is not restricted to be a "+" shape as illustrated in FIG. 4 but can be any shape such as a black circle shape or a white circle shape.

As illustrated in FIG. 4, in the mark region 21*a* of the substrate stage 21, five marks are formed similarly to the five calibration marks M formed along one end side of the photomask 1. Each mark in the mark region 21*a* is formed, for example, into a shape surrounding the border of each calibration mark M of the photomask 1. In the example illustrated in FIG. 4, each mark of the mark region 21*a* is formed as the shape of an outlined cross.

When performing correction processing of a projection condition, the photomask 1 (mask stage 22) is moved such that the calibration marks M formed at one end side of the photomask 1 are positioned above the marks formed in the mark region 21*a* of the substrate stage 24. Then, the mark detecting unit 13 detects the positions of the calibration marks M formed at the one end side of the photomask 1 and the positions of the marks formed on the substrate stage 21 (mark region 21*a*). Based on the result of the detection, at the one end side of the photomask 1, it is possible to detect a deformation state in a direction along the one end side (arrangement direction of the calibration marks M).

Thereafter, for example, the mask stage driving unit 15 starts moving of the mask stage 22, and moves the photomask 1 until the calibration marks M at the other end side of the photomask 1 (end side opposing the one end side) are positioned above the marks of the mark region 21*a*. The control unit 10 detects the moving distance of the mask stage 22 (photomask 1) at this time. The distance between a forming region of the calibration marks M formed at the one end side of the photomask 1 and a forming region of the calibration marks M formed at the other end side is previously stored in the storing unit 12, for example. Accordingly, the control unit 10 can detect a deformation state in the moving direction of the photomask 1 (direction from the one end side to the other end side where calibration marks M are formed) based on the detection result (distance between the calibration marks M).

After the calibration marks M formed at the other end side of the photomask 1 are positioned above the marks of the mark region 21*a*, the mark detecting unit 13 detects the calibration marks M at the other end side of the photomask 1 and the marks on the substrate stage 21 (mark region 21*a*). Based on the detection result, at the other end side of the photomask 1, it is also possible to detect a deformation state in a direction along the other end side (arrangement direction of the calibration marks M).

As described above, based on the result of the detection by the mark detecting unit 13, in the photomask 1, it is possible to detect a deformation state in a forming direction of the calibration marks M at the one end side and the other end side (i.e. the direction along the one end side and the other end side), and a deformation state in a direction orthogonal to the forming direction (i.e. the moving direction of the photomask 1). Then, based on the result of the detection by the mark detecting unit 13, the control unit 10 specifies a projection condition to be set (changed), and the optical system controller 14 corrects (changes) a projection condition of the optical lens system 24 to the projection condition specified by the control unit 10.

Specifically, the control unit 10 specifies a projection rate for transferring a second pattern formed on the photomask 1 into a region of a first pattern which has already been transferred on the substrate 2. Then, the optical system controller 14 changes (corrects) the projection rate in the optical lens system 24 to the projection rate specified by the control unit 10.

As illustrated in FIG. 4, when the pattern region (the region of the second pattern) in the photomask 1 is more greatly deformed than the pattern region (the region of the first pattern) on the substrate 2 by the expansion of the photomask 1, the projection rate in the optical lens system 24 is changed to a value smaller than 1. By performing the exposure processing with the changed projection rate, as indicated with an arrow in FIG. 4, it is possible to transfer the second pattern of the photomask 1 at an appropriately superimposing position with respect to the first pattern already transferred on the substrate 2.

The control unit 10 may specify not only the projection rate by the optical lens system 24 but also a projection distance from the upper surface of the substrate 2 to the optical lens system 24, for example. In this case, the optical system controller 14 changes the position of the optical lens system 24 to a position with the specified projection distance from the upper surface of the substrate 2. Thus, by performing the exposure processing after changing not only the projection rate but also the projection distance from the substrate 2, it is possible to transfer the second pattern of the photomask 1 at an appropriately superimposing position with respect to the first pattern transferred on the substrate 2.

The exposure apparatus performs various types of processing in addition to the processing of correcting a projection condition in the optical lens system 24 as described above. For example, since the optical lens system 24 is configured by connecting a plurality of lenses, the lenses come to be out of alignment due to heat from the light source unit 23 or the like when the exposure processing is continued. Accordingly, the exposure apparatus periodically performs processing for returning the lenses to predetermined positions (so-called calibration processing) by the optical system controller 14.

Also, the exposure apparatus performs alignment processing for matching the transfer positions of patterns of layers to be stacked on the substrate 2. The alignment processing is performed using an alignment mark on the photomask 1 which is formed separately from calibration marks. For example, at four corners of the photomask 1, four alignment marks are formed using a light shielding material similar to that is used for forming a pattern. The alignment marks are transferred onto the substrate 2 similarly to the pattern of the photomask 1 during the exposure processing. The exposure apparatus calculates relative positions of the alignment marks already transferred onto the substrate 2 and the alignment marks formed on the photomask 1 during the exposure processing. Then, based on the result of the calculation, the exposure apparatus adjusts a projection condition in the optical lens system 24 such that the pattern of the photomask 1 is appropriately superimposed onto the pattern already transferred on the substrate 2. The alignment processing may be performed each time exposure processing is performed.

Figure 5:
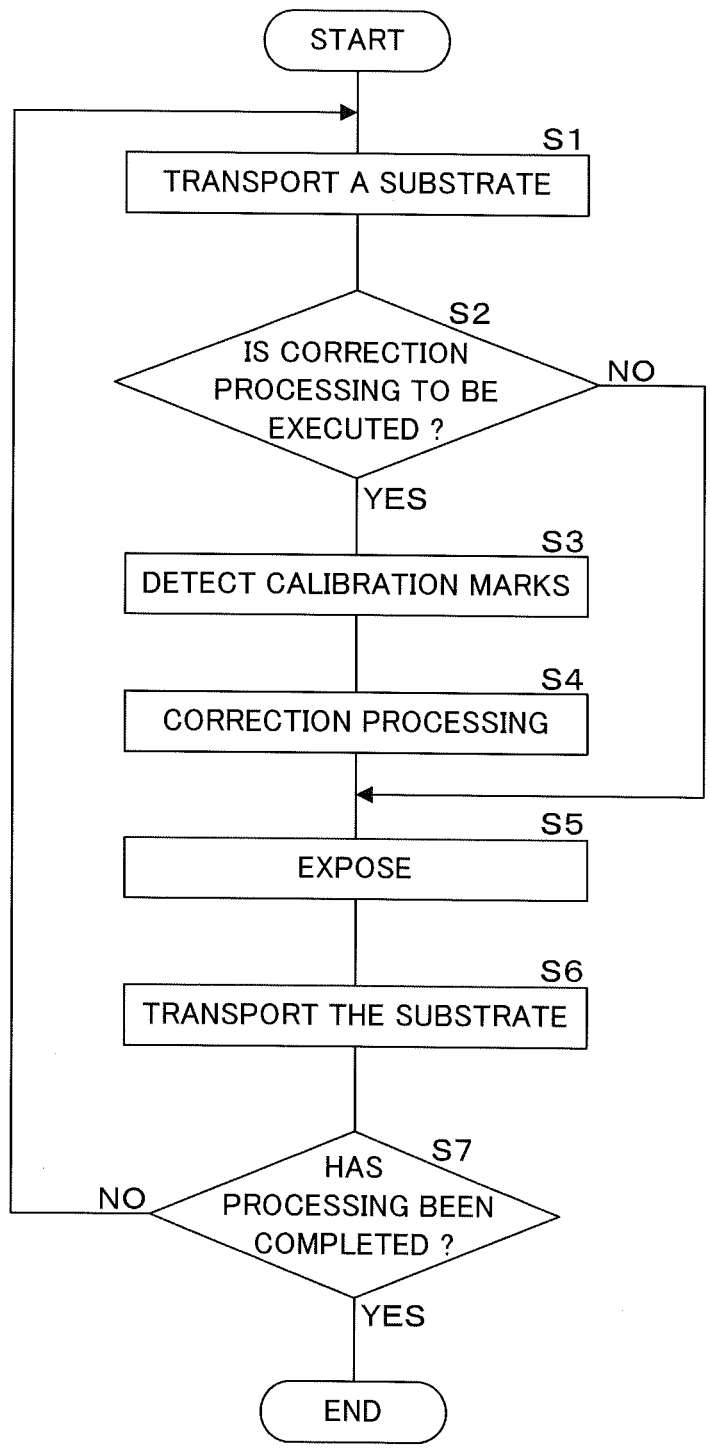
FIG. 5 is a flowchart illustrating a procedure of the exposure processing.

Next, exposure processing using the exposure apparatus of the present embodiment is described. The following processing is exposure processing when manufacturing a liquid crystal display panel, for example. FIG. 5 is a flowchart illustrating a procedure of the exposure processing. The exposure apparatus executes the following processing in a state where the amount of exposure light from the light source unit 23 is sufficient but the exposure light from the light source unit 23 is not irradiated.

The exposure apparatus transports the substrate 2, which is prepared in a predetermined position, onto the substrate stage 21 by a substrate transporting unit (not illustrated) (S1). The exposure apparatus determines whether or not correction processing of a projection condition in the optical lens system 24 is to be executed (S2). For example, the control unit 10 determines whether or not exposure processing using the same photomask 1 has been performed for the predetermined number of substrates 2, or whether or not the temperature of the photomask 1 measured with a temperature sensor (not illustrated) is equal to or more than a predetermined temperature. Then, if the exposure processing has been performed for the predetermined number of substrates 2, or if the temperature of the photomask 1 is equal to or more than the predetermined temperature, the control unit 10 determines that the correction processing is to be executed.

If it is determined that the correction processing is to be executed (S2: YES), the exposure apparatus detects the calibration marks M formed on the photomask 1 and the marks formed in the mark region 21a of the substrate stage 21 by the mark detecting unit 13 (S3). Specifically, as described above, the exposure apparatus detects the marks of the mark region 21a and the calibration marks M of the photomask 1 while moving the photomask 1 (mask stage 22) above the marks formed in the mark region 21a of the substrate stage 21. The exposure apparatus performs the correction processing based on the detection result of the calibration marks M and the marks of the mark region 21a (S4). Specifically, the control unit 10 detects the deformation state of the photomask 1 based on the detection result of the calibration marks M and the marks of the mark region 21a, and specifies a projection condition in the optical lens system 24 (for example, a projection rate), and changes (corrects) the projection condition by using the optical system controller 14. At this time, the exposure apparatus may also perform the calibration processing for returning the lenses to predetermined positions by using the optical system controller 14

If it is determined that the correction processing is not required to be executed (S2: NO), the exposure apparatus skips processing of steps S3 and S4.

After performing the correction processing, the exposure apparatus starts irradiation of the exposure light from the light source unit 23, and exposes the substrate 2 by the exposure light from the light source unit 23 in a predetermined exposure range (S5). At this time, the photomask 1 on the mask stage 22 and the substrate 2 on the substrate stage 21 move in a direction orthogonal to the exposure light from the light source unit 23. After the photomask 1 on the mask stage 22 and the substrate 2 on the substrate stage 21 have reached the predetermined positions, the exposure apparatus stops the irradiation of the exposure light from the light source unit 23 and transports the substrate 2 on the substrate stage 21 to a predetermined position by the substrate transporting unit (S6).

When the exposure processing using the same photomask 1 is performed for one substrate 2 for several times, the exposure apparatus repeats the processing of steps S2 to S5 while changing appropriately the relative position of the photomask 1 to the substrate 2.

The exposure apparatus determines whether or not the processing has been completed for all the substrates 2 to be processed (S7). If it is determined that the processing has not been completed (S7: NO), the exposure apparatus returns to the processing of step S1, and transports the substrate 2, which has been prepared in a predetermined position, onto the substrate stage 21 (S1).

The exposure apparatus repeats processing of steps S1 to S7, and if it is determined that the processing has been completed for all the substrates 2 (S7: YES), the exposure apparatus finishes the exposure processing.

EXAMPLE 1

FIGS. 6A to 6D are schematic views each illustrating a photomask 1 of Example 1. The photomask 1 illustrated in FIG. 6A has one pattern region Ra on which a pattern a is formed and two pattern regions Rb on which patterns b are formed. The pattern a is, for example, a pattern for a liquid crystal display panel having a size of larger than a liquid crystal display panel which is manufactured using the pattern b. Also, the pattern a and the pattern b are, for example, patterns for the same layer of the liquid crystal display panels of the respective sizes, and are simultaneously transferred to the substrate 2 at one exposure processing. When manufacturing a liquid crystal display panel using such a photomask 1, after performing various processing, the substrate 2 may be divided (cut) into liquid crystal display panels of the respective sizes.

Figure 6A:
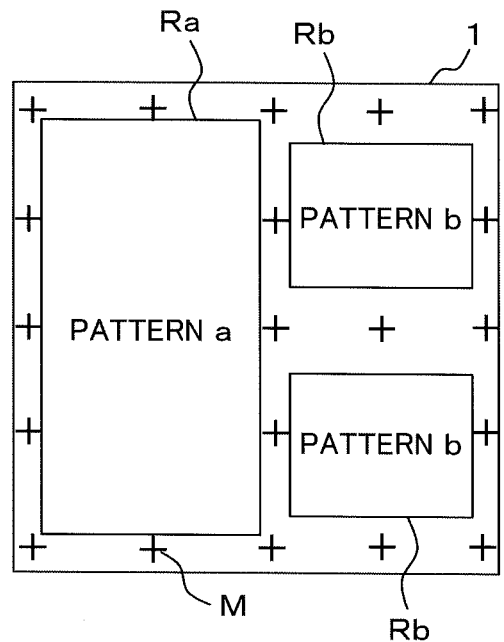
FIG. 6A is a schematic view illustrating a photomask of Example 1.
Figure 6B:
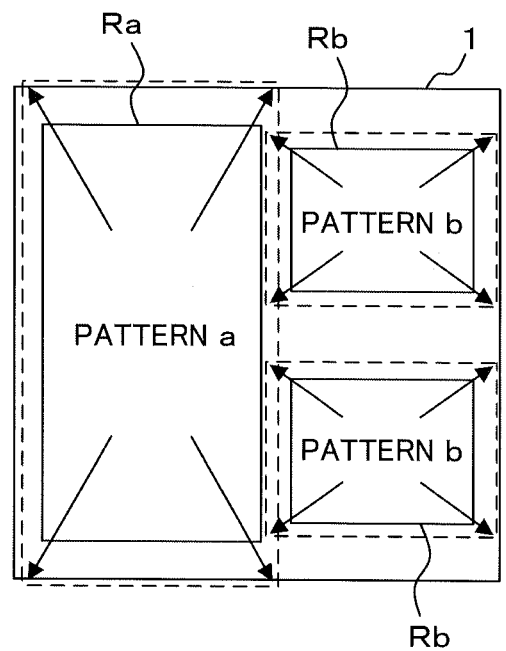
FIG. 6B is a schematic view illustrating a photomask of Example 1.

When performing exposure processing using the photomask 1 as illustrated in FIG. 6A, the pattern regions Ra and Rb are respectively expanded (deformed) as indicated by arrows in FIG. 6B. The regions indicated by broken lines in FIG. 6B respectively show the regions after the patterns Ra and Rb are deformed. In order to avoid complication of the drawings, the calibration marks M are not illustrated in FIG. 6B.

The degrees of expansion (degrees of deformation) of the pattern regions Ra and Rb vary in accordance with differences in densities and shapes (structures) of the patterns a and b, and also vary in each of the vertical direction and the horizontal direction of the pattern regions Ra and Rb. Thus, in the photomask 1 illustrated in FIG. 6A, it is difficult to specify an appropriate projection condition based on the calibration marks M formed near the two end sides of the photomask 1 as illustrated in FIG. 4.

Accordingly, as illustrated in FIG. 6A, on the photomask 1 of Example 1, a plurality of calibration marks M are formed so as to respectively surround the pattern regions Ra and Rb. For example, the photomask 1 is divided into sixteen regions in four rows and four columns, and calibration marks M are formed at positions which are an upper left, an upper right, a lower left and a lower right of each region and in which no patterns a, b are formed. As described, also when manufacturing a liquid crystal display panel using a photomask 1 on which calibration marks M are formed near the pattern regions Ra and Rb, the exposure apparatus also performs processing similar to the processing illustrated in FIG. 5. In step S3 of the processing illustrated in FIG. 5, the exposure apparatus moves the photomask 1 (mask stage 22) and detects the calibration marks M and the marks of the mark regions 21a each time the calibration marks M formed on the photomask 1 are positioned above the marks formed in the mark region 21a of the substrate stage 21. Thereby, in the example illustrated in FIG. 4, only for two end sides of the photomask 1, detection of a deformation state in a direction along the end sides is possible, whereas in Example 1, detection of a deformation state in a forming direction of calibration marks M is possible not only for two end sides of the photomask 1 but also for three locations (three regions) which are parallel to the two end sides and between the two end sides.

Also, in the example illustrated in FIG. 4, detection of a deformation state in a moving direction of the photomask 1 is possible. In Example 1, as for a moving direction of the photomask 1, based on each of the calibration marks M arranged in five columns in the moving direction, detection of a deformation state in the moving direction of the photomask 1 is possible at five locations. Accordingly, compared to the structure in which calibration marks M are provided only at two end sides of the photomask 1 as illustrated in FIG. 4, a deformation state of the photomask 1 can be detected in detail in Example 1. Thus, by using the photomask 1 of Example 1, even when the photomask 1 (pattern regions Ra and Rb) is deformed during exposure processing, it is possible to specify a suitable projection condition in accordance with the deformation state of the photomask 1.

In step S4 of the processing illustrated in FIG. 5, the exposure apparatus specifies a projection condition based on the detection result, and the optical system controller 14 changes (corrects) a projection condition of the optical lens system 24 to the specified projection condition.

Figure 6C:
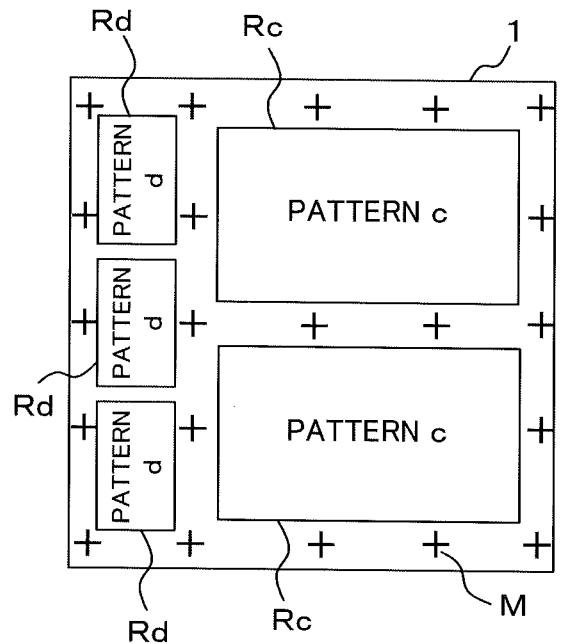
FIG. 6C is a schematic view illustrating a photomask of Example 1.
Figure 6D:
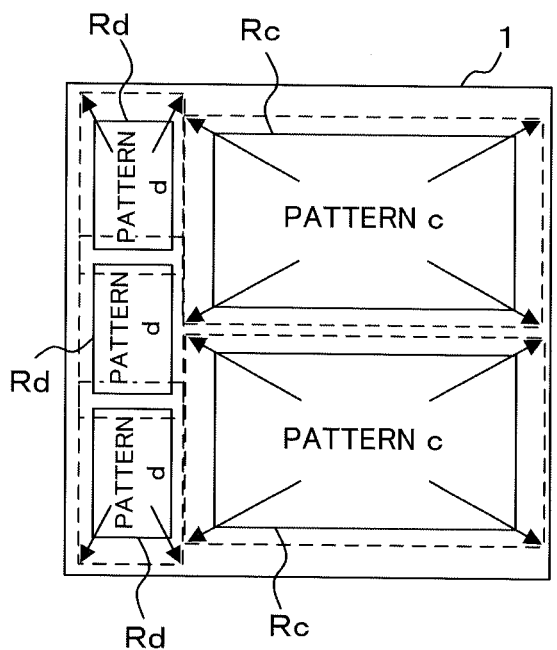
FIG. 6D is a schematic view illustrating a photomask of Example 1.

In an example illustrated in FIG. 6C as a modification of the photomask 1 of Example 1, two pattern regions Rc on which patterns c are formed and three pattern regions Rd on which patterns d are formed are provided on the photomask 1. The pattern c is, for example, a pattern for a liquid crystal display panel having a size of larger than a liquid crystal display panel which is manufactured using the pattern d, and the pattern c and the pattern d are, for example, patterns for the same layer of the liquid crystal display panels having the respective sizes. When performing exposure processing using the photomask 1 as illustrated in FIG. 6C, the pattern regions Rc and Rd are respectively expanded (deformed) as indicated by arrows in FIG. 6D. The regions indicated by broken lines in FIG. 6D respectively show the regions after the pattern regions Rc and Rd are deformed. Also, in order to avoid complication of the drawings, the calibration marks M are not illustrated in FIG. 6D.

Also in the photomask 1 illustrated in FIG. 6C, a plurality of calibration marks M are formed so as to respectively surround the pattern regions Rc and Rd.

As described above, according to Example 1, in the photomask 1, the calibration marks M are formed around the pattern regions formed on the photomask 1. Thereby, when the photomask 1 (each pattern region) is deformed during exposure processing, it is possible to detect a deformation state of each pattern region in more detail based on the calibration marks M near each pattern region. Accordingly, it is possible to specify a projection condition that allows each pattern in each pattern region to be transferred to an appropriate location on the substrate 2, and to transfer each pattern on the appropriate location on the substrate 2.

The calibration marks M are not restricted to the examples illustrated in FIG. 6A and FIG. 6C but may be formed at positions corresponding respectively to two opposite sides of each pattern region. Specifically, the calibration marks M may be formed near two opposite sides of each pattern region. Also, the number of the calibration marks M is not restricted to the numbers in the examples illustrated in FIG. 6A and FIG. 6C. It may be possible to form one calibration mark M at each of the positions corresponding respectively to the two opposite sides of each pattern region.

The photomask 1 of Example 1 can be manufactured with a process similar to the manufacturing process of an existing photomask 1. Specifically, when forming a pattern of each pattern region onto a transparent substrate (photomask 1) using a light shielding material, it is possible to form the calibration marks at a predetermined position on the transparent substrate using the light shielding material.

EXAMPLE 2

A photomask 1 of Example 2 is described.

Figure 7A:
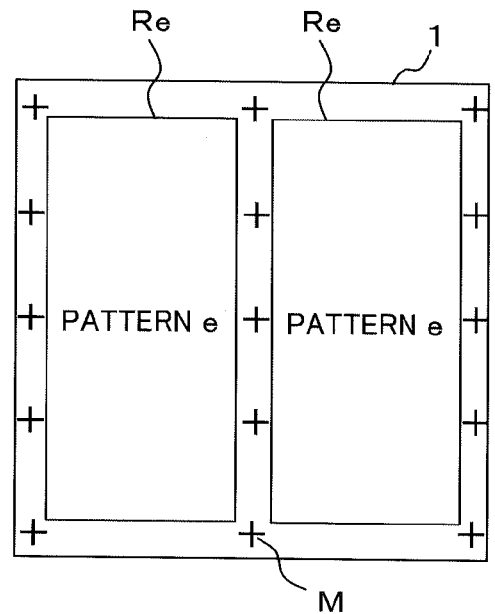
FIG. 7A is a schematic view illustrating a photomask of Example 2.

FIGS. 7A to 7D are schematic views each illustrating a photomask 1 of Example 2. As illustrated in FIG. 7A, the photomask 1 of Example 2 has two pattern regions Re on which patterns e are formed. The respective patterns e are, for example, patterns for the same layer of the liquid crystal display panels in the same size.

Figure 7B:
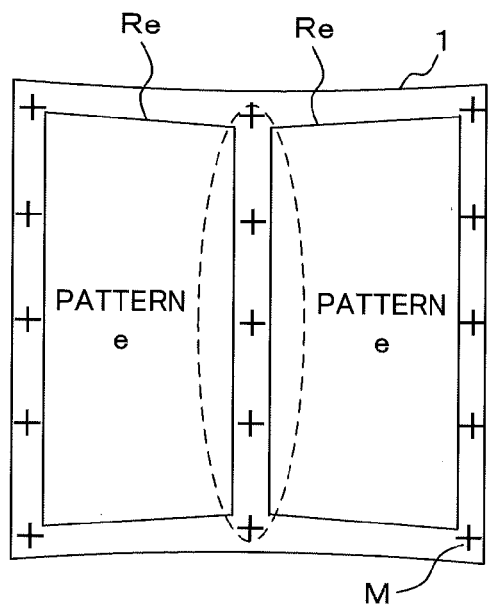
FIG. 7B is a schematic view illustrating a photomask of Example 2.

When performing exposure processing using the photomask 1 as illustrated in FIG. 7A, there is a case where the photomask 1 (each pattern region Re) is deformed as illustrated in FIG. 7B. This is caused by a difference in the degrees of expansion between a central portion sandwiched by the two pattern regions Re (portion surrounded by broken line in FIG. 7B) and two end side portions where calibration marks M are formed. Thus, in such a photomask 1, it is difficult to specify an appropriate projection condition based on the calibration marks M formed near the two end sides of the photomask 1 as illustrated in FIG. 4. Particularly, in a liquid crystal display panel of a high definition model, as the density of each pattern region Re is increased high, there is a high possibility that the degrees of expansion at the central portion and at the end side portions of the photomask 1 are further different from each other.

Then, in the photomask 1 of Example 2, as illustrated in FIG. 7A, five calibration marks M are respectively formed at positions along long sides of each of the two pattern regions Re. As described, also when manufacturing a liquid crystal display panel using the photomask 1 on which calibration marks M are formed near the pattern regions Re, the exposure apparatus performs processing similar to the processing illustrated in FIG. 5 and the processing described in Example 1. Thereby, in Example 2, it is possible to detect a deformation state in a forming direction of calibration marks M not only for two end sides of the photomask 1 but also for the central portion (region with broken line in FIG. 7B).

Also, in Example 2, it is possible to detect a deformation state in a direction orthogonal to a forming direction of five calibration marks M (for example, moving direction of the photomask 1) at the five portions based on three calibration marks M arranged in each of five columns, as in Example 1. Accordingly, in Example 2, since a deformation state of the photomask 1 can also be detected in more detail, even when the photomask 1 (each pattern region Re) is deformed during exposure processing, it is possible to specify an appropriate projection condition in accordance with a deformation state of the photomask 1.

In step S4 of the processing illustrated in FIG. 5, the exposure apparatus specifies a projection condition based on the detection result, and the optical system controller 14 changes (corrects) a projection condition of the optical lens system 24 to the specified projection condition.

Figure 7C:
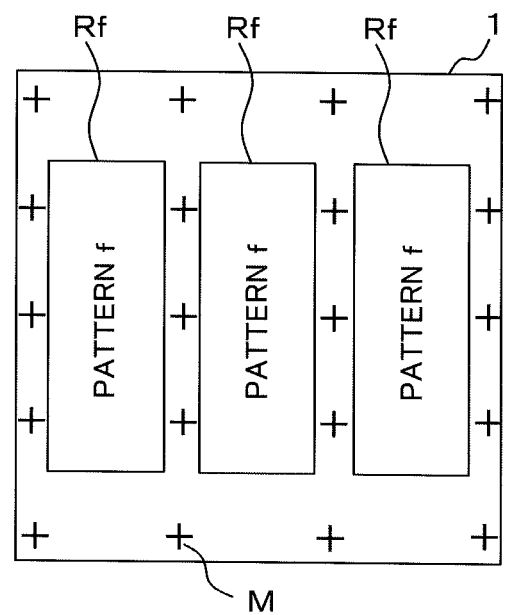
FIG. 7C is a schematic view illustrating a photomask of Example 2.

In an example illustrated in FIG. 7C as a modification of the photomask 1 of Example 2, three pattern regions Rf are arranged side by side, each having the same pattern f formed thereon. The pattern f is, for example, a pattern for the same layer of the liquid crystal display panels in the same size.

Figure 7D:
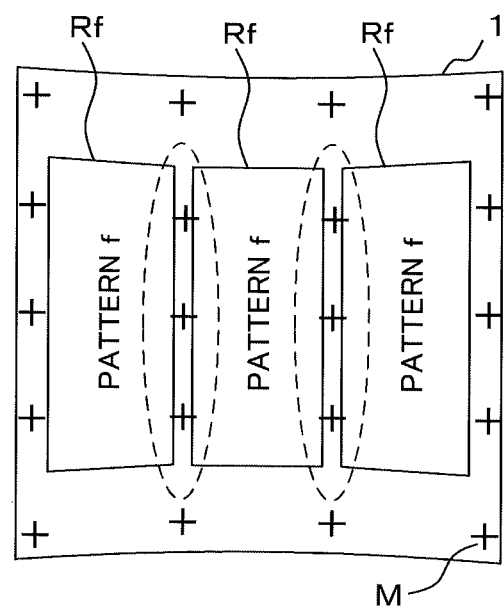
FIG. 7D is a schematic view illustrating a photomask of Example 2.

When performing exposure processing using the photomask 1 as illustrated in FIG. 7C, there is a case in which the photomask 1 (each pattern region Rf) is deformed as illustrated in FIG. 7D. In the example illustrated in FIG. 7D, the degrees of expansion are different between portions sandwiched by the respective two adjacent pattern regions Rf (two portions surrounded by broken lines) and the two end side portions where calibration marks M are formed.

Therefore, in the photomask 1 as illustrated in FIG. 7C, calibration marks M are formed at positions along long sides of each of the three pattern regions Rf. Specifically, the calibration marks M are formed at two end side portions of the photomask 1 and at two portions sandwiched by the respective two adjacent pattern regions Rf.

By using the above described photomask 1 of Example 2, even when the photomask 1 (each pattern region) is deformed during exposure processing, it is possible to detect a deformation state in each pattern region in more detail based on calibration marks M near each pattern region. Accordingly, it is possible to specify a projection condition that allows each pattern of each pattern region to be transferred to an appropriate position on the substrate 2, thereby each pattern can be transferred onto an appropriate position on the substrate 2.

In the examples illustrated in FIGS. 7A to 7D, the calibration marks M are formed at the portions along two end sides of the photomask 1 and the portions sandwiched by the pattern regions. The calibration marks M may also be formed at the portions along two end sides (upper and lower end sides in FIG. 7A to FIG. 7D) orthogonal to the above-mentioned end sides.

Also, similarly to the above-described photomask 1 of Example 1, the photomask 1 of Example 2 can be manufactured with a process similar to the manufacturing process of an existing photomask 1.

EXAMPLE 3

A photomask 1 of Example 3 is described.

Figure 8:
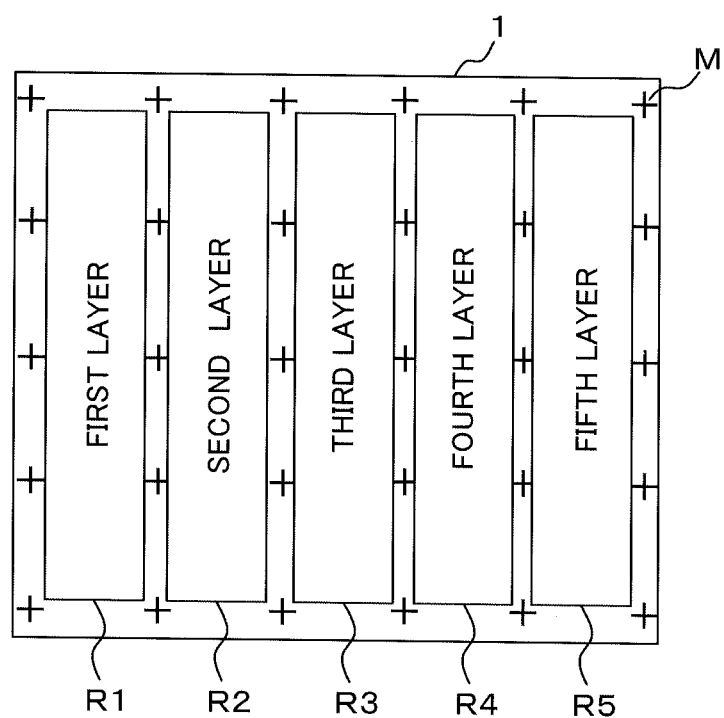
FIG. 8 is a schematic view illustrating a photomask of Example 3.

FIG. 8 is a schematic view illustrating a photomask 1 of Example 3. The photomask 1 of Example 3 has five pattern regions R1 to R5, for example. In the pattern regions R1 to R5, patterns for the different layers of the liquid crystal display panels having the same size are respectively formed. The layers are sequentially denoted as a first layer, a second layer, a third layer . . . in the order of being transferred to the substrate 2. When using such a photomask 1, for example, a liquid crystal display panel is manufactured by transferring the pattern of each layer in the photomask 1 to the substrate 2 in a predetermined order.

Figure 9A:
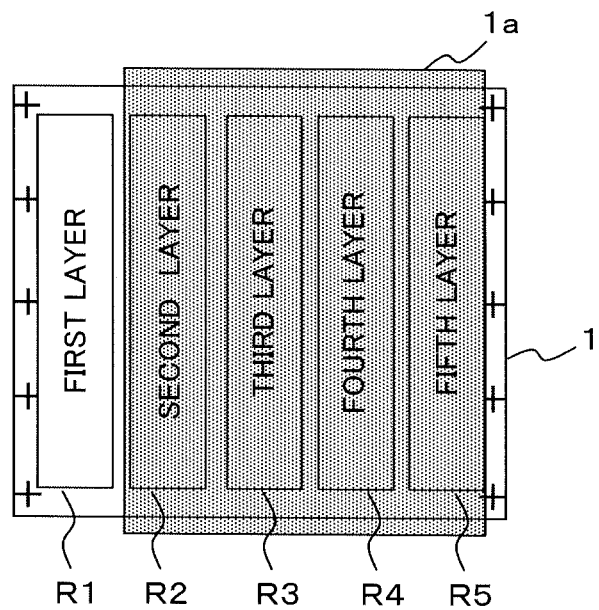
FIG. 9A is a schematic view for explaining exposure processing using the photomask of Example 3.
Figure 9B:
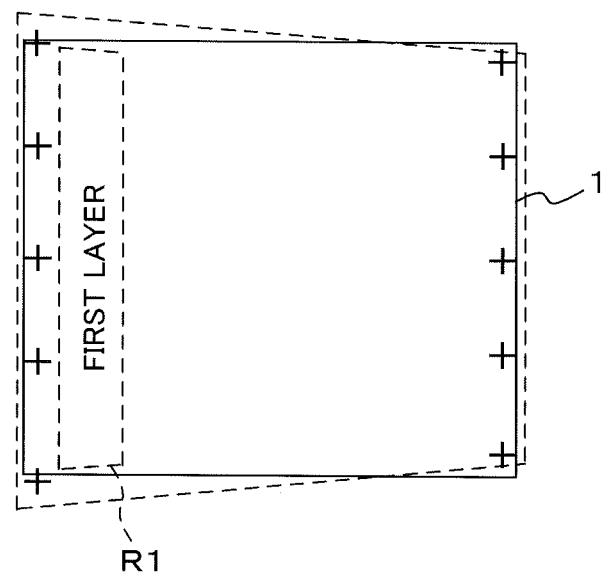
FIG. 9B is a schematic view for explaining exposure processing using the photomask of Example 3.

FIGS. 9A and 9B are schematic views for explaining exposure processing using the photomask of Example 3. In order to avoid complication of the drawings, some of calibration marks M are not illustrated in FIGS. 9A and 9B, and also pattern regions R2 to R5 are not illustrated in FIG. 9B.

When performing exposure processing using the photomask 1 including patterns of different layers, the regions R2 to R5 other than the pattern region R1 to be exposed are shielded as illustrated in FIG. 9A. FIG. 9A illustrates a state when the pattern of the first layer is transferred to the substrate 2, and the regions R2 to R5 are included in a light shielding region 1a. For example, a light shielding plate (not illustrated) is placed near the upper surface or the lower surface of the photomask 1, and the light shielding region 1a can appropriately be changed by using the light shielding plate.

When performing exposure processing in such a state, only the exposed portion is expanded (deformed), and the portion which are not exposed (light shielding region 1a) are not expanded. In the state illustrated in FIG. 9A, only the pattern region R1 of the first layer is expanded, and the other pattern regions R2 to R5 are not expanded.

However, in the photomask 1 as deformed in such a manner, when specifying a projection condition based on the calibration marks M formed near the two end sides of the photomask 1 as illustrated in FIG. 4, it is considered that the photomask 1 is deformed into a trapezoidal shape as shown by broken lines in FIG. 9B. That is, although the pattern region R1 is expanded (deformed) in a rectangular shape in fact, it is assumed to be deformed in a trapezoidal shape as shown by broken lines in FIG. 9B, and a projection condition for correcting the trapezoidal shape to the rectangular shape is specified. Thus, in the photomask 1 which is deformed as in Example 3, it is difficult to specify an appropriate projection condition based on calibration marks M formed near two end sides of the photomask 1.

Accordingly, in the photomask 1 of Example 3, as illustrated in FIG. 8, the calibration marks M are formed at positions along long sides of the respective pattern regions R1 to R5. Also when manufacturing a liquid crystal display panel using the photomask 1 on which the calibration marks M are formed near the pattern regions R1 to R5, the exposure apparatus performs processing similar to the processing illustrated in FIG. 5 and the processing described in Example 1. In Embodiment 3, in step S3 of the processing illustrated in FIG. 5, the exposure apparatus moves the photomask 1 (mask stage 22) and detects the calibration marks M and the marks of the mark region 21a each time the calibration marks M formed near the respective pattern regions R1 to R5 (photomask 1) to be exposed are positioned above the marks formed in the mark region 21a of the substrate stage 21. Thus, in Example 3, it is possible to detect a deformation state in a moving direction of the photomask 1 and a deformation state in a direction orthogonal to the moving direction in the pattern region to be exposed to light. Accordingly, even when a part of the photomask 1 (any of the pattern regions R1 to R5) is deformed during exposure processing, it is possible to appropriately detect deformation states of the pattern regions R1 to R5, and specify appropriate projection conditions in accordance with the deformation states of the pattern regions R1 to R5.

In step S4 of the processing illustrated in FIG. 5, the exposure apparatus specifies a projection condition based on the detection result, and the optical system controller 14 changes (corrects) a projection condition of the optical lens system 24 to the specified projection condition.

By using the above described photomask 1 of Example 3, even when a part of the photomask 1 (any of the pattern regions R1 to R5) is deformed during exposure processing, it is possible to detect deformation states in the pattern regions R1 to R5 in more detail based on the calibration marks M near the pattern regions R1 to R5. Thus, it is possible to specify a projection condition that allows each pattern in each pattern region to be transferred to an appropriate position on the substrate 2, and transfer the patterns in the pattern regions R1 to R5 to appropriate positions on the substrate 2.

In the example illustrated in FIG. 8, the calibration marks M are formed at the positions along two end sides of the photomask 1 and the positions sandwiched by the respective adjacent pattern regions R1 to R5. The calibration marks M may also be formed at the positions along two end sides (upper and lower end sides in FIG. 8) orthogonal to the above-mentioned end sides.

Also, similarly to the above described photomask 1 of Example 1, the photomask 1 of Example 3 can be manufactured with a process similar to the manufacturing process of an existing photomask 1.

EXAMPLE 4

A photomask 1 of Example 4 is described. The photomask 1 of Example 4 is a modification of the above described photomask 1 of Example 3.

Figure 10A:
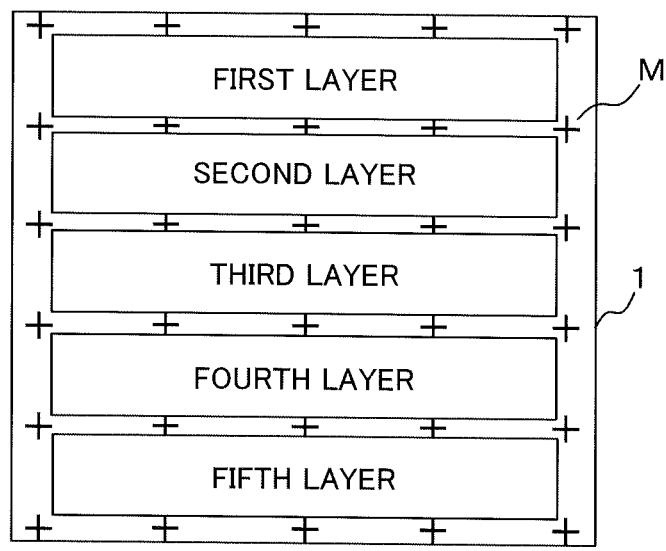
FIG. 10A is a schematic view illustrating a photomask of Example 4.
Figure 10B:
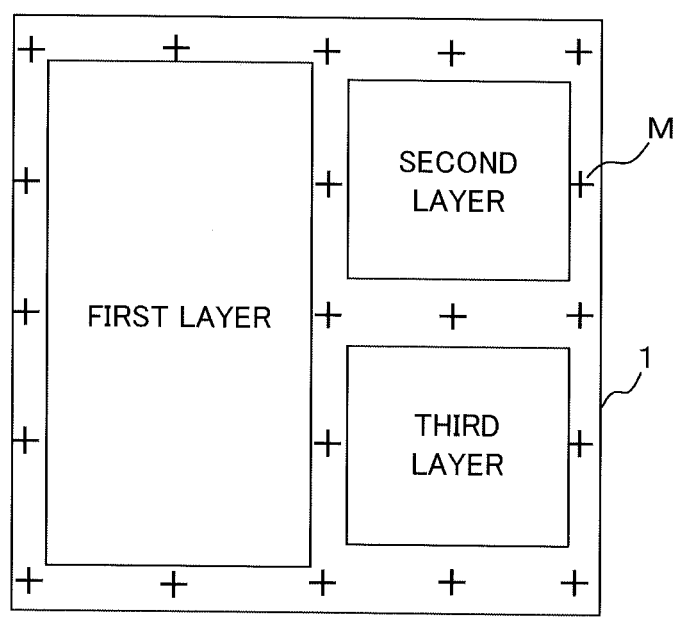
FIG. 10B is a schematic view illustrating a photomask of Example 4.

FIGS. 10A and 10B are schematic views each illustrating a photomask 1 of Example 4. The photomask 1 illustrated in FIG. 10A is provided with, for example, five pattern regions. In the pattern regions, patterns for the different layers of the liquid crystal display panels having the same size are respectively formed. In the example illustrated in FIG. 8, each pattern region is placed in such a manner that a longitudinal direction thereof corresponds to an up-down direction (vertical direction), while in the example illustrated in FIG. 10A, each pattern region is placed in such a manner that a longitudinal direction thereof corresponds to a right-left direction (horizontal direction).

Also, the photomask 1 illustrated in FIG. 10B is provided with pattern regions having respectively patterns for different layers of liquid crystal display panels having the same size. In the example illustrated in FIG. 10B, pattern regions having different sizes are formed on the photomask 1.

In the photomasks 1 each illustrated in FIGS. 10A and 10B, by forming calibration marks M around the respective pattern regions, even when a part of the photomask 1 (any of the pattern regions) is deformed during exposure processing, it is possible to detect a deformation state of each pattern region based on calibration marks M near each pattern region. Accordingly, it is possible to specify, based on the detection result, a projection condition that allows each pattern in each pattern region to be transferred to an appropriate position on the substrate 2, thereby each pattern can be transferred onto an appropriate position of the substrate 2.

According to the above described Examples 1 to 4, the calibration marks M are formed on the photomask 1 using a same light shielding material as the light shielding material for a pattern formed on the photomask 1. Accordingly, a calibration mark M can be formed at the time of forming a pattern on the photomask 1 (transparent substrate). Thus, it is not necessary to greatly change the manufacturing process of the photomask 1, thereby not causing an increase in the manufacturing cost of the photomask 1.

In the above described Examples 3 and 4, a structure in which exposure processing is performed while shielding a part of the photomask 1 is described. For the above mentioned photomask 1 illustrated in Examples 1 and 2, it is also possible to perform exposure processing while shielding a part of the photomask 1. In this case also, it is possible to appropriately detect a deformation state of a pattern region to be exposed to light based on calibration marks M near the pattern region. Accordingly, it is possible to specify a projection condition for transferring a pattern in the pattern region to be exposed to light onto an appropriate position of the substrate 2.

As this description may be embodied in several forms without departing from the spirit of essential characteristics thereof, the present embodiments are therefore illustrative and not restrictive, since the scope of the present invention is defined by the appended claims rather than by the description preceding them, and all changes that fall within metes and bounds of the claims, or equivalence of such metes and bounds thereof are therefore intended to be embraced by the claims. Also, the technical features described in the respective examples can be combined with each other.

The invention claimed is:

1. A photomask including a plurality of pattern regions having patterns formed with a light shielding material, and transferring the patterns to a photoresist with light passed through the pattern regions, wherein
   each of the pattern regions has a rectangular shape;
   the photomask includes marks at positions corresponding respectively to two opposite sides of each of the pattern regions; and
   at least one of the pattern regions has a shape and size different from shapes and sizes of the other pattern regions.

2. The photomask according to claim 1, wherein the marks are formed with a same light shielding material as the light shielding material for the pattern.

3. The photomask according to claim 1, wherein the marks are located at positions corresponding respectively to four sides of each of the pattern regions.

4. The photomask according to claim 1, wherein at least one of the pattern regions has a pattern with an order in which the pattern is transferred to the photoresist, the order being different from orders of patterns of the other pattern regions.

5. An exposure apparatus comprising the photomask according to claim 1, wherein the exposure apparatus transfers a pattern formed on the photomask to a substrate applied with a photoresist.

6. The exposure apparatus according to claim 5, comprising:
   a substrate stage on which a mark is located at a predetermined position and a substrate to be exposed to light is mounted:
   a mounting table on which the photomask is mounted; and
   a setting unit that sets an exposure condition based on the mark of substrate stage and the marks of the photomask mounted on the mounting table.

7. The exposure apparatus according to claim 6, wherein the mark of the substrate stage corresponds to each of a first mark which is the mark of the photomask and is located at a position corresponding to a first end side of one of the pattern regions, and a second mark which is the mark of the photomask and is located at a position corresponding to a second end side opposite the first end side of the one of the pattern regions,
   the exposure apparatus further comprises a detector that detects a deformation state of the photomask in a direction along the first end side and a deformation state of the photomask in a direction from the first end side to the second end side, based on the mark of the substrate stage and the first mark and second mark of the photomask, and
   the setting unit sets the exposure condition based on a detection result by the detector.

8. The exposure apparatus according to claim 7, wherein in a first state in which the first mark is positioned above the mark of the substrate stage, the detector detects the position of the first mark and the position of the mark of the substrate stage, and detects the deformation state of the photomask in the direction along the first end side based on the detected positions of the first mark and the mark of the substrate stage, and the detector detects the deformation state of the photomask in the direction from the first end side to the second end side based on a moving distance of the mounting table from the first state to a second state in which the second mark is positioned above the mark of the substrate stage.

9. An exposure apparatus comprising:
a substrate stage on which a mark is located at a predetermined position and a substrate to be exposed to light is mounted;
a mounting table on which the photomask is mounted, the photomask including a plurality of rectangular pattern regions having patterns formed with a light shielding material and marks located at positions corresponding respectively to two opposite sides of each pattern region; and
a setting unit that sets an exposure condition based on the mark of the substrate stage and the marks of the photomask mounted on the mounting table.

10. The exposure apparatus according to claim 9, wherein
the mark of the substrate stage corresponds to each of a first mark which is the mark of the photomask and is located at a position corresponding to a first end side of one of the pattern regions, and a second mark which is the mark of the photomask and is located at a position corresponding to a second end side opposite the first end side of the one of the pattern regions,
the exposure apparatus further comprises a detector that detects a deformation state of the photomask in a direction along the first end side and a deformation state of the photomask in a direction from the first end side to the second end side, based on the mark of the substrate stage and the first mark and second mark of the photomask, and
the setting unit sets the exposure condition based on a detection result by the detector.

11. The exposure apparatus according to claim 10, wherein
in a first state in which the first mark is positioned above the mark of the substrate stage, the detector detects the position of the first mark and the position of the mark of the substrate stage, and detects the deformation state of the photomask in the direction along the first end side based on the detected positions of the first mark and the mark of the substrate stage, and
the detector detects the deformation state of the photomask in the direction from the first end side to the second end side based on a moving distance of the mounting table from the first state to a second state in which the second mark is positioned above the mark of the substrate stage.

* * * * *